(12) United States Patent
Cho et al.

(10) Patent No.: US 11,864,396 B2
(45) Date of Patent: *Jan. 2, 2024

(54) FLEXIBLE DISPLAY DEVICE AND METHOD OF MANUFACTURING THE SAME

(71) Applicant: Samsung Display Co., Ltd., Yongin-si (KR)

(72) Inventors: Ki Hyun Cho, Yongin-si (KR); Yong Jae Park, Yongin-si (KR); Sang Jo Lee, Yongin-si (KR); Won Suk Choi, Yongin-si (KR); Yoon Sun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/128,993

(22) Filed: Mar. 30, 2023

(65) Prior Publication Data

US 2023/0240101 A1 Jul. 27, 2023

Related U.S. Application Data

(60) Continuation of application No. 17/087,059, filed on Nov. 2, 2020, now Pat. No. 11,647,652, which is a (Continued)

(30) Foreign Application Priority Data

Oct. 6, 2016 (KR) .................. 10-2016-0129098

(51) Int. Cl.
*H10K 59/124* (2023.01)
*H10K 59/131* (2023.01)
(Continued)

(52) U.S. Cl.
CPC ....... *H10K 59/124* (2023.02); *H10K 59/1216* (2023.02); *H10K 59/131* (2023.02); (Continued)

(58) Field of Classification Search
CPC ............. H10K 59/124; H10K 59/1216; H10K 59/131; H10K 77/111; H10K 59/1201; (Continued)

(56) References Cited

U.S. PATENT DOCUMENTS 8,791,455 B2   7/2014 Kim et al.
9,082,667 B2   7/2015 Youn et al.
(Continued)

FOREIGN PATENT DOCUMENTS

CN   105609521   5/2016
CN   105895655   9/2016
(Continued)

OTHER PUBLICATIONS

Supplemental Notice of Allowance dated May 3, 2018, in U.S. Appl. No. 15/603,362.
(Continued)

*Primary Examiner* — Samuel A Gebremariam
(74) *Attorney, Agent, or Firm* — H.C. Park & Associates, PLC

(57) ABSTRACT

A flexible display device including a substrate, a light emitting layer, a first insulating layer, and a conductive layer. The substrate includes a bent region and a non-bent region. The light emitting layer overlaps the non-bent region. The first insulating layer is disposed on the substrate. The conductive layer is disposed on the first insulating layer. A sidewall of the first insulating layer includes a first tapered surface. The first tapered surface includes at least three curved surface portions continuously arranged with one another.

18 Claims, 12 Drawing Sheets

Related U.S. Application Data continuation of application No. 16/515,025, filed on Jul. 18, 2019, now Pat. No. 10,825,878, which is a continuation of application No. 16/041,952, filed on Jul. 23, 2018, now Pat. No. 10,403,698, which is a division of application No. 15/603,365, filed on May 23, 2017, now Pat. No. 10,056,444.

(51) Int. Cl.
  *H10K 59/121*   (2023.01)
  *H10K 77/10*    (2023.01)
  *H01L 27/12*    (2006.01)
  *H10K 59/12*    (2023.01)
  *H10K 102/00*   (2023.01)

(52) U.S. Cl.
  CPC .......... *H10K 77/111* (2023.02); *H01L 27/124* (2013.01); *H01L 27/1218* (2013.01); *H01L 27/1248* (2013.01); *H10K 59/1201* (2023.02); *H10K 2102/311* (2023.02); *Y02E 10/549* (2013.01)

(58) Field of Classification Search
  CPC .......... H10K 2102/311; H01L 27/1218; H01L 27/124; H01L 27/1248
  See application file for complete search history.

(56) References Cited

U.S. PATENT DOCUMENTS

| | | | |
|---|---|---|---|
| 9,287,342 | B2 | 3/2016 | Kwon et al. |
| 9,419,063 | B2 | 8/2016 | Kim et al. |
| 9,419,065 | B2 | 8/2016 | Degner et al. |
| 9,583,549 | B2 | 2/2017 | You |
| 10,347,702 | B2 | 7/2019 | Youn et al. |
| 10,825,878 | B2 * | 11/2020 | Cho ................. H10K 59/1216 |
| 11,647,652 | B2 * | 5/2023 | Cho ................. H10K 59/1216 257/71 |
| 2002/0030437 | A1 | 3/2002 | Shimizu et al. |
| 2005/0214571 | A1 | 9/2005 | Kishimoto |
| 2014/0306941 | A1 | 10/2014 | Kim et al. |
| 2016/0087022 | A1 | 3/2016 | Tsai et al. |
| 2016/0172428 | A1 | 6/2016 | Song et al. |
| 2016/0174304 | A1 | 6/2016 | Kim et al. |
| 2016/0211472 | A1 | 7/2016 | Oh |
| 2017/0062539 | A1 | 3/2017 | Tsai et al. |

FOREIGN PATENT DOCUMENTS

| | | |
|---|---|---|
| EP | 3037873 | 6/2016 |
| KR | 10-2014-0045193 | 4/2014 |
| KR | 10-2014-0122960 | 10/2014 |
| KR | 10-2014-0140150 A | 12/2014 |
| KR | 10-2015-0074808 | 7/2015 |
| KR | 10-2016-0047132 A | 5/2016 |

OTHER PUBLICATIONS

Notice of Allowance dated Apr. 23, 2018, in U.S. Appl. No. 15/603,362.
Notice of Allowance dated Apr. 19, 2019, in U.S. Appl. No. 16/041,952.
Non-Final Office Action dated Oct. 5, 2018, in U.S. Appl. No. 16/041,952.
Notice of Allowance dated Jul. 6, 2020, in U.S. Appl. No. 16/515,025.
Notice of Allowance dated Mar. 9, 2020, in U.S. Appl. No. 16/515,025.
Non-Final Office Action dated Nov. 18, 2019, in U.S. Appl. No. 16/515,025.
Non-Final Office Action dated Apr. 17, 2023, issued to U.S. Appl. No. 17/087,059.
Notice of Allowance dated Jan. 5, 2023, issued to U.S. Appl. No. 17/087,059.

* cited by examiner

FLEXIBLE DISPLAY DEVICE AND METHOD OF MANUFACTURING THE SAME

CROSS-REFERENCE TO RELATED APPLICATIONS

This application is a Continuation of U.S. patent application Ser. No. 17/087,059, filed on Nov. 2, 2020, which is a Continuation of U.S. patent application Ser. No. 16/515, 025, filed Jul. 18, 2019, which is a Continuation of U.S. patent application Ser. No. 16/041,952, filed Jul. 23, 2018, which issued as U.S. Pat. No. 10,403,698, which is a Divisional of U.S. patent application Ser. No. 15/603,362, filed May 23, 2017, which issued as U.S. Pat. No. 10,056, 444, and claims priority to and the benefit of Korean Patent Application No. 10-2016-0129098, filed Oct. 6, 2016, each of which is hereby incorporated by reference for all purposes as if fully set forth herein.

BACKGROUND

Field

One or more exemplary embodiments relate to a flexible display device and a method of manufacturing the same.

Discussion

Demand for portable display devices and interest in flexible display devices that may be bent, folded, or otherwise deformed via external forces of a user are increasing. A flexible display device may include a flexible substrate, a thin film transistor (TFT), and a light emitting unit. When an inorganic material is arranged in a bent region of the flexible display device, stress caused by bending the flexible display device may, in turn, cause the inorganic material to be transformed (e.g., volumetrically deformed) and damaged. When a step difference is provided in the bent region and a metal material is arranged on the step difference, the metal material may be cut off, cracked, or otherwise damaged due to the step difference.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a flexible display device including a metal wiring line on a curved surface to prevent (or at least reduce) the potential of the metal wiring line from being shorted.

One or more exemplary embodiments provide a flexible display device in which inorganic material arranged in a bending region is removed via laser radiation to reduce the number of masks used to manufacture the flexible display device.

One or more exemplary embodiments provide a method of manufacturing a flexible display device including a metal wiring line on a curved surface to prevent (or at least reduce) the potential of the metal wiring line from being shorted.

One or more exemplary embodiments provide a method of manufacturing a flexible display device in which inorganic material arranged in a bending region is removed via laser radiation to reduce the number of masks used to manufacture the flexible display device.

Additional aspects will be set forth in the detailed description which follows, and, in part, will be apparent from the disclosure, or may be learned by practice of the inventive concepts.

According to one or more exemplary embodiments, a flexible display device includes a substrate, a light emitting layer, a first insulating layer, and a conductive layer. The substrate includes a bent region and a non-bent region. The light emitting layer overlaps the non-bent region. The first insulating layer is disposed on the substrate. The conductive layer is disposed on the first insulating layer. A sidewall of the first insulating layer includes a first tapered surface. The first tapered surface includes at least three curved surface portions continuously arranged with one another.

According to one or more exemplary embodiments, a method of manufacturing a flexible display device includes forming a first insulating layer on a surface of a substrate, the substrate including a bending region and a non-bending region; removing, via laser radiation, a portion of the first insulating layer, the portion of the first insulating layer overlapping the bending region; forming a conductive layer on the first insulating layer; and forming a light emitting layer overlapping the non-bending region.

According to one or more exemplary embodiments, since the metal material of a conductive layer is arranged on a curved surface, it is possible to provide a flexible display device in which the metal material of the conductive layer is not cut off, as well as possible to provide a method of manufacturing the same. In addition, according to one or more exemplary embodiments, since an inorganic material arranged in the bent region is removed by radiating a laser onto the inorganic material, it is possible to provide a method of manufacturing a flexible display device in which the number of masks used to manufacture the flexible display device is reduced, as may be manufacturing time and costs.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
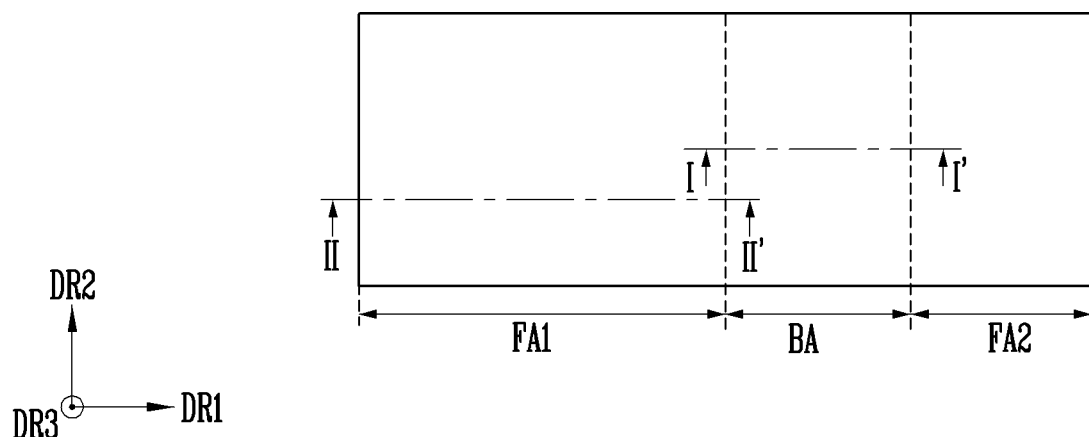
FIG. 1 is a view of a flexible display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
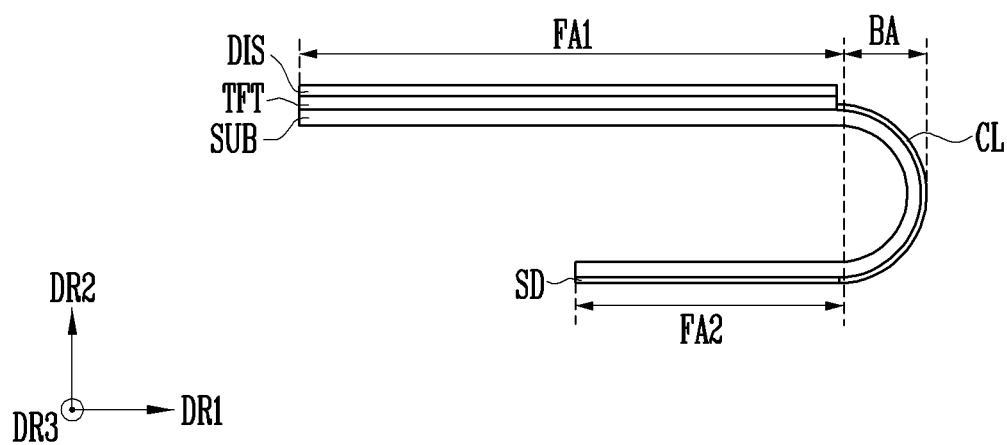
FIG. 2 is a cross-sectional view of the flexible display device of FIG. 1 in a bent state, according to one or more exemplary embodiments.

FIG. 1 is a view of a flexible display device, according to one or more exemplary embodiments. FIG. 2 is a cross-sectional view of the flexible display device of FIG. 1 in a bent state, according to one or more exemplary embodiments.

Referring to FIGS. 1 and 2, the flexible display device has a substrate SUB including a first non-bent region FA1, a bent region BA, and a second non-bent region FA2. The first non-bent region FA1 and the second non-bent region FA2 may be manufactured in various shapes to implement various functions. For example, a light emitting unit (or structure) DIS that displays an image and a thin film transistor layer TFT that drives the light emitting unit DIS may be arranged in (e.g., overlap) the first non-bent region FA1. Although illustrated as single layers, the light emitting unit DIS and the thin film transistor layer TFT may include a plurality of layers, as will become more apparent below. A circuit pattern SD that applies a signal for driving at least one of the thin film transistor layer TFT and the light emitting unit DIS may be arranged in (e.g., overlap) the second non-bent region FA2. A conductive layer CL may be arranged in (e.g., overlap) the bent region BA. The conductive layer CL may be used as a wiring (or signal) line that transmits the signal from the circuit pattern SD to at least one of the thin film transistor layer TFT and the light emitting unit DIS.

FIGS. 3A, 3B, 3C, and 3D are cross-sectional views of the flexible display device of FIG. 1 taken along sectional line I-I', according to one or more exemplary embodiments.

Figure 3A:
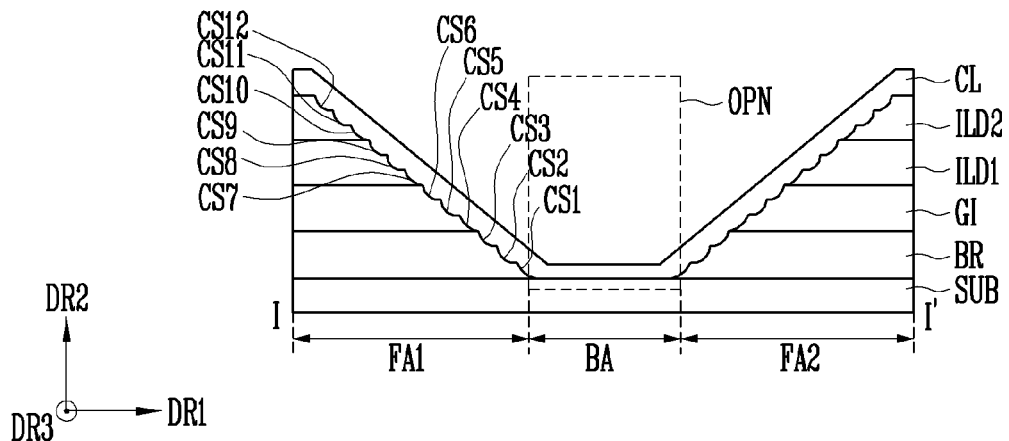
FIGS. 3A, 3B, 3C, and 3D are cross-sectional views of the flexible display device of FIG. 1 taken along sectional line I-I', according to one or more exemplary embodiments.

Referring to FIG. 3A, in at least one of the first non-bent region FA1 and the second non-bent region FA2, a barrier layer BR, a gate insulating layer GI, a first interlayer insulating layer ILD1, a second interlayer insulating layer ILD2, and the conductive layer CL are sequentially arranged on the substrate SUB. It is also contemplated that one or more portions of at least one of the barrier layer BR, the gate insulating layer GI, the first interlayer insulating layer ILD1, the second interlayer insulating layer ILD2, and the conductive layer CL may overlap the bent region BA, such as one or more portions of the barrier layer BR.

The substrate SUB may be formed of a flexible material to be bent, folded, or otherwise deformed. The substrate SUB may have a single layer structure or a multilayer structure. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material of which the substrate SUB is formed may vary and may include fiber glass reinforced plastic.

The barrier layer BR increases smoothness of a surface (e.g., top surface) of the substrate SUB and/or prevents impurities from the substrate SUB from permeating into the gate insulating layer GI, the first interlayer insulating layer ILD1, the second interlayer insulating layer ILD2, and the conductive layer CL. The barrier layer BR may have a tapered sidewall provided with continuously arranged curved surfaces CS1, CS2, and CS3. According to one or more exemplary embodiments, the number of curved surfaces provided on the sidewall of the barrier layer BR may be larger than three.

The barrier layer BR may have a multilayer structure. Among the multiple layers, a layer that contacts the substrate SUB may include at least one of silicon nitride, silicon oxide, and silicon oxynitride, and may increase the smoothness of the substrate SUB. Among the multiple layers, layers that do not contact the substrate SUB may include at least one of silicon nitride, silicon oxide, and silicon oxynitride, and may prevent the impurities from the substrate SUB from permeating into the gate insulating layer GI, the first interlayer insulating layer ILD1, the second interlayer insulating layer ILD2, and the conductive layer CL.

The gate insulating layer GI may include at least one of the materials described to be included in the barrier layer BR. The gate insulating layer GI may have a tapered sidewall provided with continuously arranged curved surfaces CS4, CS5, and CS6. According to one or more exemplary embodiments, the number of curved surfaces provided on the sidewall of the gate insulating layer GI may be larger than three.

The first interlayer insulating layer ILD1 may include at least one of the materials described to be included in the barrier layer BR. The first interlayer insulating layer ILD1 may have a tapered sidewall provided with continuously arranged curved surfaces CS7, CS8, and CS9. According to one or more exemplary embodiments, the number of curved surfaces provided on the sidewall of the first interlayer insulating layer ILD1 may be larger than three.

The second interlayer insulating layer ILD2 may include at least one of the materials described to be included in the barrier layer BR. The second interlayer insulating layer ILD2 may have a tapered sidewall provided with continuously arranged curved surfaces CS10, CS11, and CS12. According to one or more exemplary embodiments, the number of curved surfaces provided on the sidewall of the second interlayer insulating layer ILD2 may be larger than three.

The conductive layer CL is arranged on the second interlayer insulating layer ILD2 and may include metal, for example, at least one of aluminum (Al), titanium (Ti), gold (Au), silver (Ag), copper (Cu), nickel (Ni), platinum (Pt), and molybdenum (Mo). According to one or more exemplary embodiments, the conductive layer CL may have a multilayer structure. For example, the conductive layer CL may have a three-layer structure of Ti/Al/Ti.

An opening OPN is formed in each of the barrier layer BR, the gate insulating layer GI, the first interlayer insulating layer ILD1, and the second interlayer insulating layer ILD2 in a region overlapping the bent region BA. Since the opening OPN separates opposing portions of the barrier layer BR, the gate insulating layer GI, the first interlayer insulating layer ILD1, and the second interlayer insulating layer ILD2 in a region overlapping the bent region BA, although the bent region BA is bent, stress is not applied to (or may be reduced in) the barrier layer BR, the gate insulating layer GI, the first interlayer insulating layer ILD1, and the second interlayer insulating layer ILD2. In addition, since the conductive layer CL is arranged on a tapered surface provided with a flat part or the curved surfaces CS1 through CS12, although the bent region BA is bent, the conductive layer CL is not cut off, cracked, or otherwise damaged. To this end, the tapered surface provided with a flat part and/or curved surfaces CS1 through CS12 may increase surface area in which the conductive layer CL contacts at least one of the barrier layer BR, the gate insulating layer GI, the first interlayer insulating layer ILD1, and the second interlayer insulating layer ILD2. This increase in contacting surface area may also prevent (or at least reduce) the potential for the conductive layer CL from lifting off of (e.g., delaminating from) the barrier layer BR, the gate insulating layer GI, the first interlayer insulating layer ILD1, and the second interlayer insulating layer ILD2.

According to one or more exemplary embodiments, the barrier layer BR, the gate insulating layer GI, the first interlayer insulating layer ILD1, and the second interlayer insulating layer ILD2 may respectively be a first insulating layer, a second insulating layer, a third insulating layer, and a fourth insulating layer.

Figure 3B:
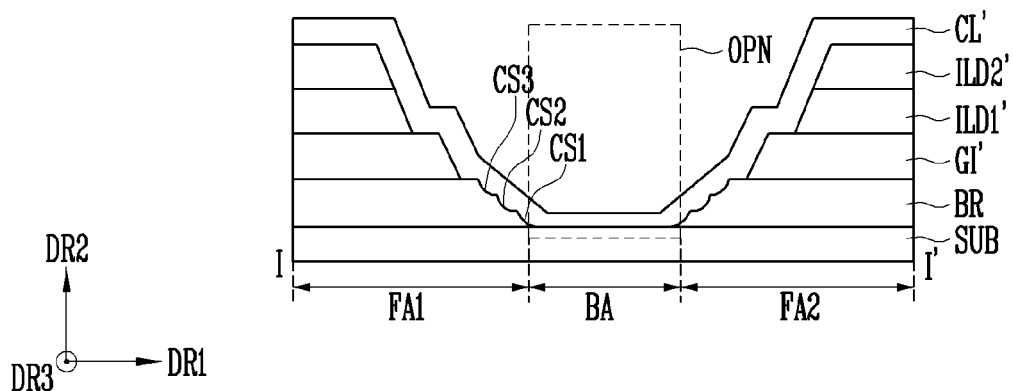

Referring to FIG. 3B, in at least one of the first non-bent region FA1 and the second non-bent region FA2, the barrier layer BR, a gate insulating layer GI', a first interlayer insulating layer ILD1', a second interlayer insulating layer ILD2', and the conductive layer CL are sequentially arranged on the substrate SUB. It is also contemplated that one or more portions of at least one of the barrier layer BR, the gate insulating layer GI', the first interlayer insulating layer ILD1', the second interlayer insulating layer ILD2', and the conductive layer CL' may overlap the bent region BA, such as one or more portions of the barrier layer BR. For convenience, description of the same (or similar) elements as those described with reference to FIG. 3A will be omitted to avoid obscuring exemplary embodiments.

Unlike the gate insulating layer GI illustrated in FIG. 3A, the gate insulating layer GI' has a tapered sidewall without curved surfaces. Unlike the first interlayer insulating layer ILD1 illustrated in FIG. 3A, the first interlayer insulating layer ILD1' has a tapered sidewall without curved surfaces. Unlike the second interlayer insulating layer ILD2 illustrated in FIG. 3A, the second interlayer insulating layer ILD2' has a tapered sidewall without curved surfaces.

As seen in FIG. 3B, a step difference (e.g., a lateral spacing) is provided between the gate insulating layer GI' and the first interlayer insulating layer ILD1', which is only an exemplary embodiment. According to one or more exemplary embodiments, step difference may be provided between the first interlayer insulating layer ILD1' and the second interlayer insulating layer ILD2' or in at least one of (or between at least two of) the gate insulating layer GI', the first interlayer insulating layer ILD1', and the second interlayer insulating layer ILD2'.

Since the barrier layer BR, the gate insulating layer GI', the first interlayer insulating layer ILD1', and the second interlayer insulating layer ILD2' have opposing portions that are separated from each other due to the opening OPN provided in the bent region BA, although the bent region BA is bent, stress is not applied to (or may be reduced in) the barrier layer BR, the gate insulating layer GI', the first interlayer insulating layer ILD1', and the second interlayer insulating layer ILD2'. In addition, since the conductive layer CL' is arranged on the tapered surface provided with a flat part or curved surfaces CS1 through CS3, although the bent region BA is bent, the conductive layer CL is not cut off. To this end, the tapered surface provided with a flat part and/or curved surfaces CS1 through CS3 may increase surface area in which the conductive layer CL' contacts at least one of the barrier layer BR, the gate insulating layer GI', the first interlayer insulating layer ILD1', and the second interlayer insulating layer ILD2'. This increase in contacting surface area may also prevent (or at least reduce) the potential for the conductive layer CL' from lifting off of (e.g., delaminating from) the barrier layer BR, the gate insulating layer GI', the first interlayer insulating layer ILD1', and the second interlayer insulating layer ILD2'.

Figure 3C:
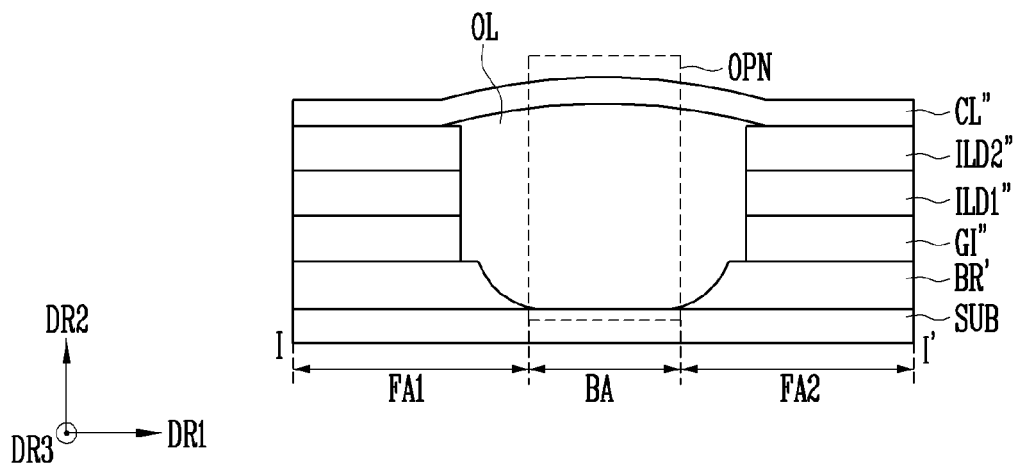

Referring to FIG. 3C, in at least one of the first non-bent region FA1 and the second non-bent region FA2, a barrier layer BR', a gate insulating layer GI", a first interlayer insulating layer ILD1", a second interlayer insulating layer ILD2", an organic layer OL, and the conductive layer CL are sequentially arranged on the substrate SUB. It is also contemplated that one or more portions of at least one of the barrier layer BR', the gate insulating layer GI", the first interlayer insulating layer ILD1", the second interlayer insulating layer ILD2", the organic layer OL, and the conductive layer CL" may overlap the bent region BA, such as one or more portions of the organic layer OL. For convenience, description of the same (or similar) elements as those described with reference to FIGS. 3A and 3B will be omitted to avoid obscuring exemplary embodiments.

Unlike the barrier layer BR illustrated in FIG. 3A, the barrier layer BR' may have a tapered sidewall provided with a curved surface. According to one or more exemplary embodiments, the barrier layer BR' may have a tapered sidewall without a curved surface or may have a differently shaped sidewall. Unlike the gate insulating layer GI illustrated in FIG. 3A, a sidewall of the gate insulating layer GI" may not be provided with curved surfaces, nor may it be tapered. A sidewall of the first interlayer insulating layer ILD1" may not be provided with curved surfaces, nor may it be tapered. A sidewall of the second interlayer insulating layer ILD2" may not be provided with curved surfaces, nor may it be tapered.

The organic layer OL may be arranged to fill (or at least partially fill) the opening OPN. Due to the opening OPN, the sidewalls and step differences of the barrier layer BR', the gate insulating layer GI", the first interlayer insulating layer ILD1", and the second interlayer insulating layer ILD2" are not exposed to the outside. An exposed part of the organic layer OL may be tapered. To this end, a surface (e.g., an upper surface) of the organic layer OL opposing a surface (e.g., upper surface) of the substrate SUB may be curved. For instance, the surface of the organic layer OL may arcuately protrude away from the surface of the substrate SUB. The conductive layer CL" is arranged on the organic layer OL.

Since the barrier layer BR', the gate insulating layer GI", the first interlayer insulating layer ILD1", and the second interlayer insulating layer ILD2" have opposing portions that are separated from each other due to the opening OPN provided in the bent region BA, although the bent region BA is bent, stress is not applied to (or may be reduced in) the barrier layer BR', the gate insulating layer GI", the first interlayer insulating layer ILD1", and the second interlayer insulating layer ILD2". In addition, since the conductive layer CL" is arranged on a flat part of the second interlayer insulating layer ILD2" or the exposed tapered surface of the organic layer OL, although the bent region BA is bent, the conductive layer CL" is not cut off. To this end, the tapered surface of the organic layer OL may increase surface area in which the conductive layer CL" contacts the organic layer OL in the bent region BA. This increase in contacting surface area may also prevent (or at least reduce) the potential for the conductive layer CL" from lifting off of (e.g., delaminating from) the organic layer OL.

Figure 3D:
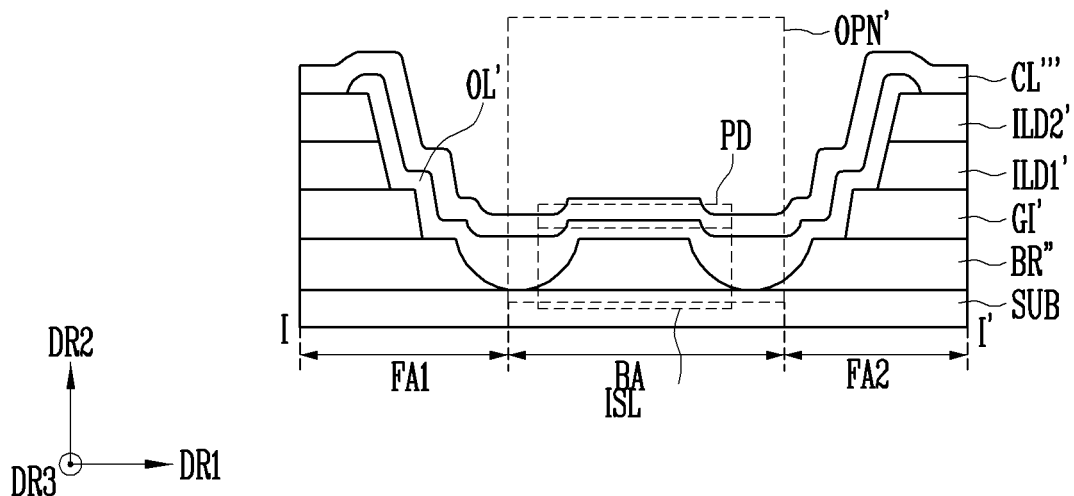

Referring to FIG. 3D, in at least one of the first non-bent region FA1 and the second non-bent region FA2, a barrier layer BR", the gate insulating layer GI', the first interlayer insulating layer ILD1', the second interlayer insulating layer ILD2', an organic layer OL', and the conductive layer CL'" are sequentially arranged on the substrate SUB. It is also contemplated that one or more portions of at least one of the barrier layer BR", the gate insulating layer GI', the first interlayer insulating layer ILD1', the second interlayer insulating layer ILD2', the organic layer OL', and the conductive layer CL'" may overlap the bent region BA, such as one or more portions of the barrier layer BR" and the organic layer OL'. For convenience, description of the same (or similar) elements as those described with reference to FIGS. 3A to 3C will be omitted to avoid obscuring exemplary embodiments.

The barrier layer BR" has an island ISL overlapping the bent region BA. The island ISL does not contact a part excluding the island ISL of the barrier layer BR". According to one or more exemplary embodiments, one or more surfaces (e.g., sidewall surfaces) of the island ISL may be tapered.

The organic layer OL' has a concavo-convex part PD. A shape of the concavo-convex part PD corresponds to that of the island ISL. A part of the organic layer OL' is tapered and a remaining part of the organic layer OL' is flat. For example, when the island ISL is tapered, a shape of the concavo-convex part PD may be tapered.

Since the barrier layer BR'', the gate insulating layer GI', the first interlayer insulating layer ILD1', and the second interlayer insulating layer ILD2' have opposing portions that are separated from each other due to the opening OPN' provided in the bent region BA, although the bent region BA is bent, stress is not applied to (or may be reduced in) the barrier layer BR'', the gate insulating layer GI', the first interlayer insulating layer ILD1', and the second interlayer insulating layer ILD2'. In addition, since the conductive layer CL''' is arranged on a flat part of the second interlayer insulating layer ILD2' or the flat part and the tapered surface of the organic layer OL', although the bent region BA is bent, the conductive layer CL''' is not cut off.

In addition, since the conductive layer CL''' is arranged on the concavo-convex part PD of the organic layer OL', a part of the conductive layer CL''' may also be concavo-convex. When the conductive layer CL''' is concavo-convex, stress applied to the conductive layer CL''' due to the bending of the bent region BA may be reduced. To this end, the tapered surface of the organic layer OL' may increase surface area in which the conductive layer CL''' contacts the organic layer OL' in the bent region BA. This increase in contacting surface area may also prevent (or at least reduce) the potential for the conductive layer CL''' from lifting off of (e.g., delaminating from) the organic layer OL'.

Figure 4:
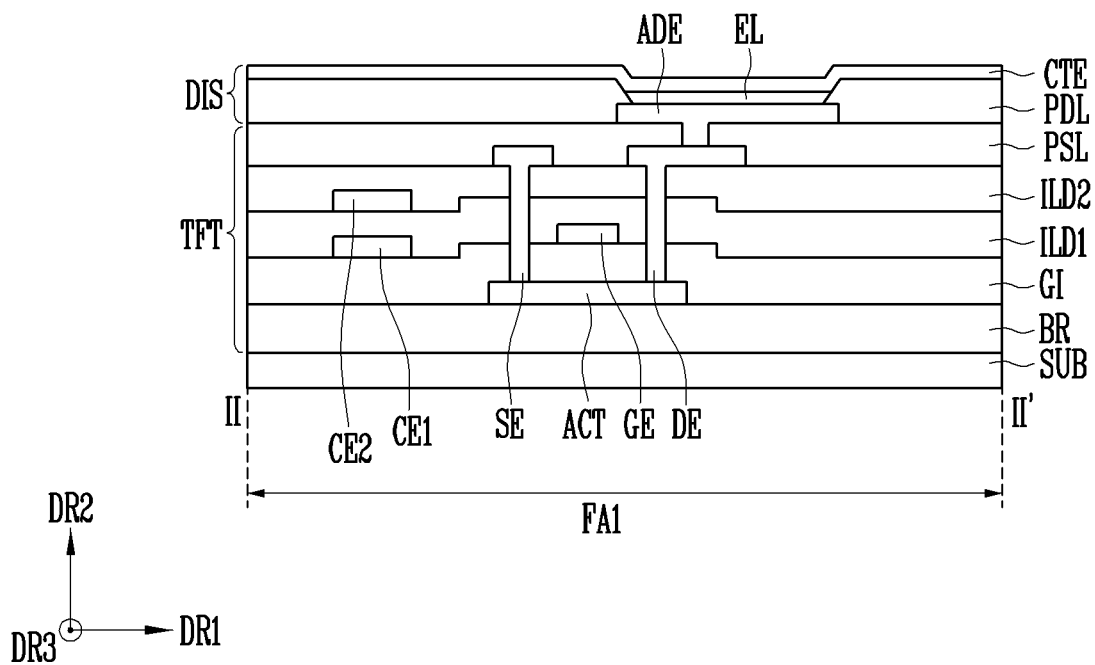
FIG. 4 is a cross-sectional view of a portion of a pixel of the flexible display device of FIG. 1 taken along sectional line II-II', according to one or more exemplary embodiments.

FIG. 4 is a cross-sectional view of a portion of a pixel of the flexible display device of FIG. 1 taken along sectional line II-II', according to one or more exemplary embodiments. In the first non-bent region FA1, the thin film transistor layer TFT and the light emitting unit DIS are sequentially arranged on the substrate SUB.

The thin film transistor layer TFT includes a barrier layer BR, an active pattern ACT, a gate insulating layer GI, a gate electrode GE, a first capacitor electrode CE1, a first interlayer insulating layer ILD1, a second capacitor electrode CE2, a second interlayer insulating layer ILD2, a source electrode SE, a drain electrode DE, and a passivation layer PSL. For convenience, only elements not described in association with at least one of FIGS. 3A through 3D will be described in association with FIG. 4. In other words, since the barrier layer BR, the gate insulating layer GI, the first interlayer insulating layer ILD1, and the second interlayer insulating layer ILD2 were described in association with at least one of FIGS. 3A through 3D, duplicative descriptions will be omitted to avoid obscuring exemplary embodiments.

The active pattern ACT is arranged between the barrier layer BR and the gate insulating layer GI. Although not illustrated, the active pattern ACT may include a channel region provided in a source region or a drain region or between the source region and the drain region. The active region ACT includes a semiconductor material and may include at least one of polysilicon, amorphous silicon, and a semiconductor oxide. It is contemplated, however, that any other suitable material may be utilized in association with exemplary embodiments. The channel region as a semiconductor pattern that is not doped with impurities and may be an intrinsic semiconductor. The source region and the drain region may be semiconductor patterns doped with impurities. The impurities may be at least one of n-type impurities, p-type impurities, and other metals.

The gate electrode GE and the first capacitor electrode CE1 are arranged between the gate insulating layer GI and the first interlayer insulating layer ILD1. That is, the gate electrode GE and the first capacitor electrode CE1 are arranged on the same plane or disposed at the same layer as one another. The gate electrode GE may be arranged to overlap the channel region of the active pattern ACT. The gate electrode GE and the first capacitor electrode CE1 may include a metal, for example, at least one of Al, Ti, Au, Ag, Co, Ni, Pt, and Mo. According to one or more exemplary embodiments, the gate electrode GE and the first capacitor electrode CE1 may have a single layer structure or a multilayer structure. For instance, the gate electrode GE and the first capacitor electrode CE1 may have a multilayer structure of Ti/Al/Ti.

The second capacitor electrode CE2 is arranged between the first interlayer insulating layer ILD1 and the second interlayer insulating layer ILD2. The second capacitor electrode CE2 may include one of the materials described to be included in the first capacitor electrode CE1 and may have a single layer structure or a multilayer structure. The first capacitor electrode CE1 and the second capacitor electrode CE2 may form a capacitor with the first interlayer insulating layer ILD1 disposed between the first capacitor electrode CE1 and the second capacitor electrode CE2.

The source electrode SE and the drain electrode DE are arranged on the second interlayer insulating layer ILD2. The source electrode SE may be arranged to overlap the source region of the active pattern ACT. The drain electrode DE may be arranged to overlap the drain region of the active pattern ACT. The source electrode SE and the drain electrode DE contact the active pattern ACT through contact holes formed in the gate insulating layer GI, the first interlayer insulating layer ILD1, and the second interlayer insulating layer ILD2. In one or more exemplary embodiments, the source electrode SE and the drain electrode DE may be arranged on the same plane (or disposed at the same layer) as the conductive layer CL illustrated in FIG. 3A, a configuration that will be described in detail with reference to FIGS. 6I and 6J.

The passivation layer PSL may be arranged on the source electrode SE and the drain electrode DE. The passivation layer PSL may include an inorganic material and may further include an organic material according to one or more exemplary embodiments. The inorganic material may include at least one of silicon nitride, silicon oxide, and silicon oxynitride. The organic material may include photoacryl.

The light emitting unit DIS includes a first electrode ADE, a pixel defining layer PDL, a emission layer EL, and a second electrode CTE.

The first electrode ADE is arranged on the passivation layer PSL and contacts the drain electrode DE through a contact hole in the passivation layer PSL. The first electrode ADE may include a metal and a conductive oxide. For instance, the metal may include at least one of Ag, magnesium (Mg), Al, Pt, palladium (Pd), Au, Ni, neodymium (Nd), iridium (Ir), and chromium (Cr). The conductive oxide may include at least one of aluminum zinc oxide (AZO), gallium zinc oxide (GZO), indium tin oxide (ITO), indium zinc oxide (IZO), zinc oxide (ZnO), and indium tin zinc oxide (ITZO).

The pixel defining layer PDL is arranged on the passivation layer PSL and the first electrode ADE, and exposes at least a portion of the first electrode ADE.

The emission layer EL is arranged on a portion of the first electrode ADE that is exposed by the pixel defining layer PDL. The emission layer EL may include a low molecular organic material or a high molecular organic material, and may have a single layer structure or a multilayer structure. For example, the emission layer EL may include a hole injection layer HIL, a hole transport layer HTL, an emission layer EML, an electron transport layer ETL, and an electron injection layer EIL.

The second electrode CTE is arranged on the pixel defining layer PDL and the emission layer EL. The second electrode CTE may include at least one of the materials described to be included in the first electrode ADE. The second electrode CTE may have a single layer structure or a multilayer structure.

Figure 5A:
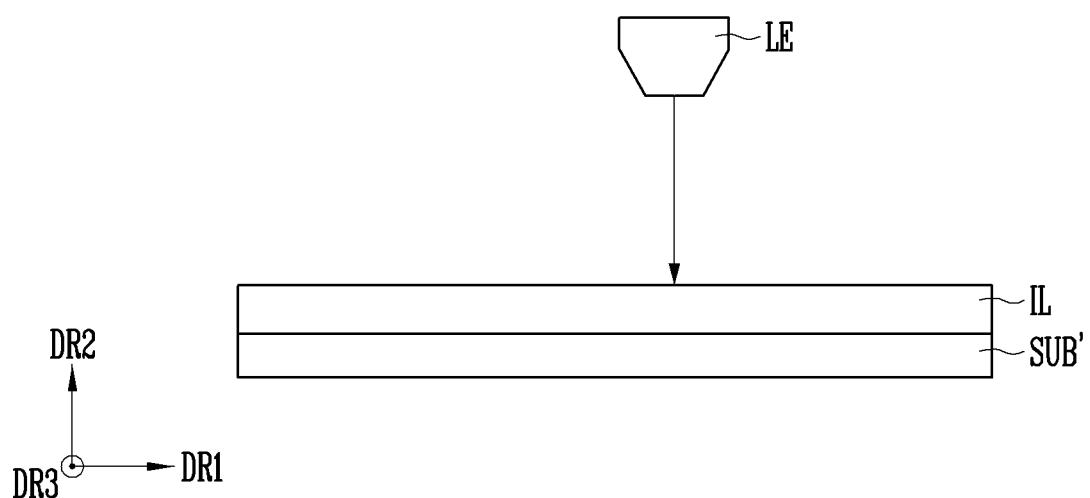
FIGS. 5A and 5B are cross-sectional views of a flexible display device at various stages of being laser ablated, according to one or more exemplary embodiments.
Figure 5B:
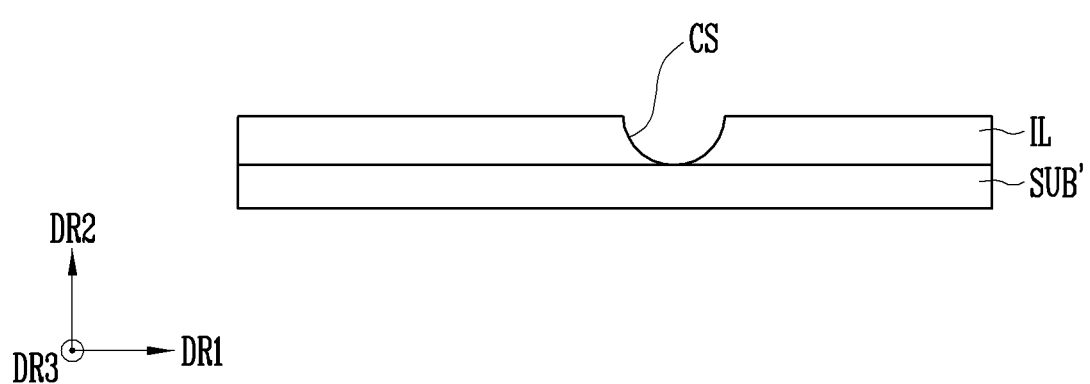

FIGS. 5A and 5B are cross-sectional views of a flexible display device at various stages of being laser ablated, according to one or more exemplary embodiments.

For instance, FIG. 5A illustrates a laser emitter LE radiating a laser onto an inorganic layer IL that is disposed on substrate SUB'. FIG. 5B illustrates the substrate SUB' and the inorganic layer IL onto which the laser is radiated. A part of the inorganic layer IL is removed by the radiating laser onto the inorganic layer IL. In this manner, a tapered sidewall is formed in the inorganic layer IL. The tapered sidewall has a curved surface CS.

Conventionally, patterning via a photolithography process, a photoresist coating process, a process of selective exposure using a mask, and a development process have been utilized. To reduce manufacturing cost and time, one or more exemplary embodiments reduce the number of photolithography processes to manufacture the flexible display device. That is, when patterning is performed via the photolithography process to prevent (or at least reduce) the material arranged in the bent region from being transformed and damaged due to the bending of the flexible display device, manufacturing cost and time may increase. According to one or more exemplary embodiments, a laser is selectively radiated to pattern a material arranged in the bent region to prevent (or at least reduce) the material arranged in the bent region from being transformed and damaged due to the bending of the flexible display device. In this manner, the photolithography process may be omitted, and, as such, reductions in manufacturing cost and time may be achieved.

FIGS. 6A, 6B, 6C, 6D, 6E, 6F, 6G, 6H, 6I, 6J, and 6K are cross-sectional views of a flexible display device at various stages of manufacture, according to one or more exemplary embodiments. For convenience, a process of manufacturing a flexible display device will be described in association with the flexible display device of FIGS. 3A and 4. Also, for descriptive and illustrative convenience, various intermediate features will be described and referenced as corresponding to the feature eventually formed in the flexible display device.

Figure 6A:
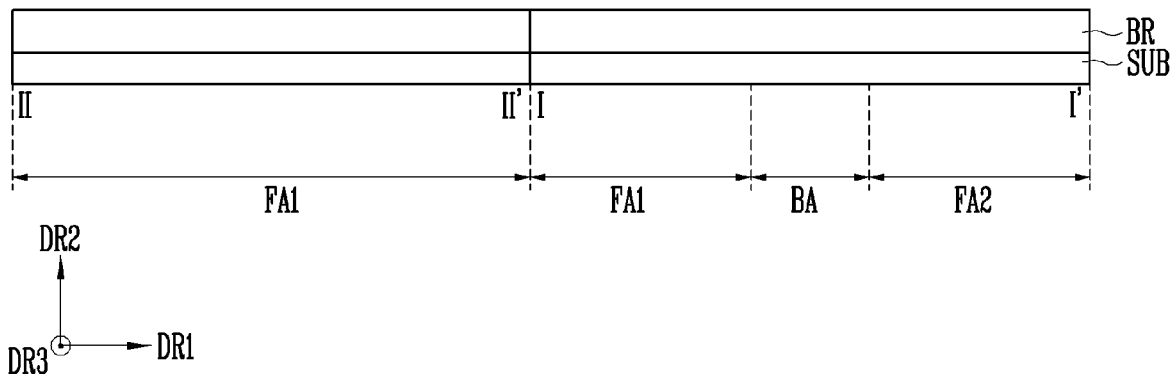
FIGS. 6A, 6B, 6C, 6D, 6E, 6F, 6G, 6H, 6I, 6J, and 6K are cross-sectional views of a flexible display device at various stages of manufacture, according to one or more exemplary embodiments.

In FIG. 6A, the barrier layer BR is formed on the substrate SUB. The barrier layer BR may be formed overlapping the first non-bent region FA1 and the bent region BA. It is also contemplated that the barrier layer BR may be formed overlapping the second non-bent region FA2. The barrier layer BR may be formed by a chemical vapor deposition (CVD) method, for example, a plasma enhanced CVD (PECVD) method.

Figure 6B:
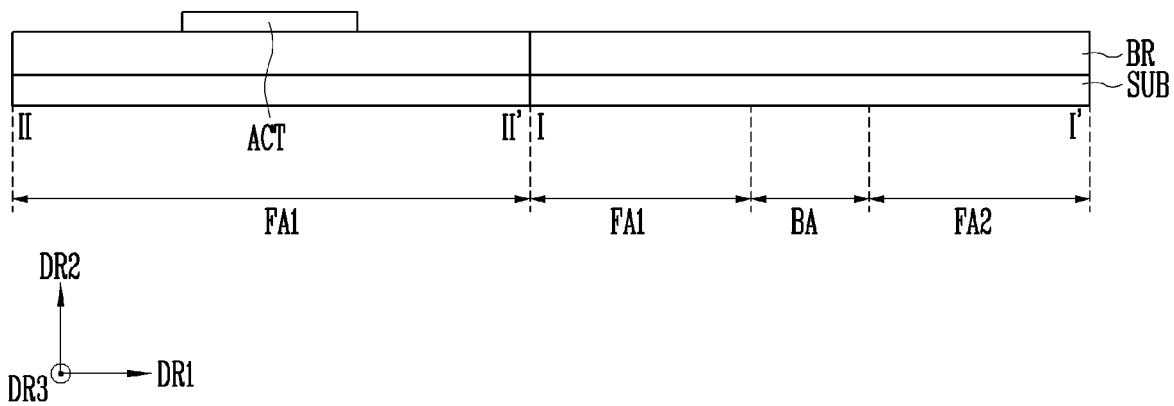

In FIG. 6B, the active pattern ACT is formed on the barrier layer BR. The active pattern ACT may be formed overlapping the first non-bent region FA1.

Figure 6C:
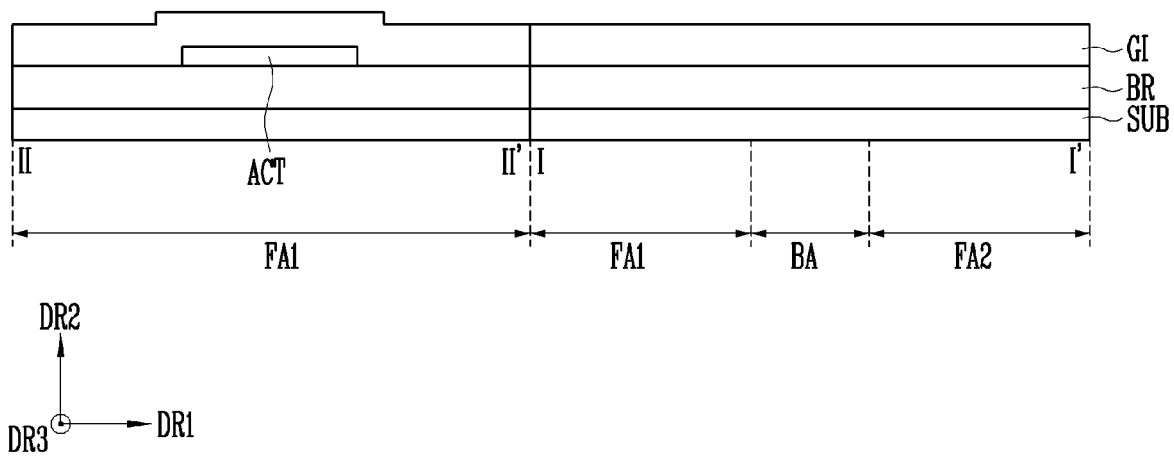

In FIG. 6C, the gate insulating layer GI is formed on the active pattern ACT and exposed portions of the barrier layer BR. The gate insulating layer GI may be formed on the first non-bent region FA1 and the bent region BA. It is also contemplated that the barrier layer BR may be formed overlapping the second non-bent region FA2. The gate insulating layer GI may be formed by the CVD method like the barrier layer BR.

Figure 6D:
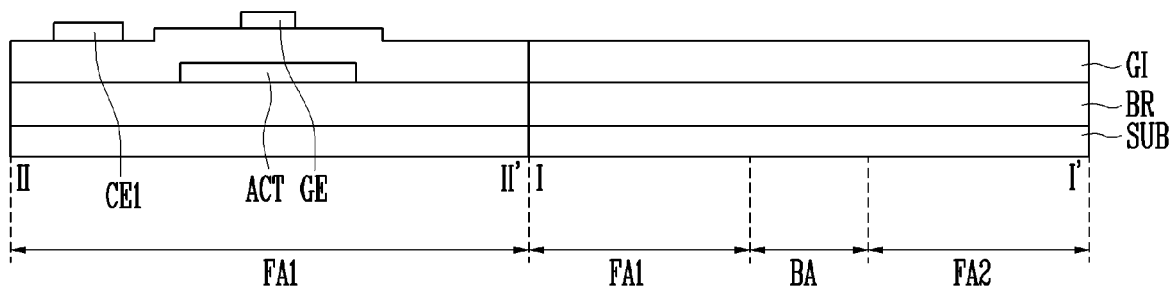

In FIG. 6D, the gate electrode GE and the first capacitor electrode CE1 are formed on the gate insulating layer GI. The gate electrode GE and the first capacitor electrode CE1 may be formed overlapping the first non-bent region FA1. The gate electrode GE may be formed to correspond to (e.g., overlapping) the channel region of the active pattern ACT. The gate electrode GE and the first capacitor electrode CE1 may be formed by a physical vapor deposition (PVD) method.

Figure 6E:
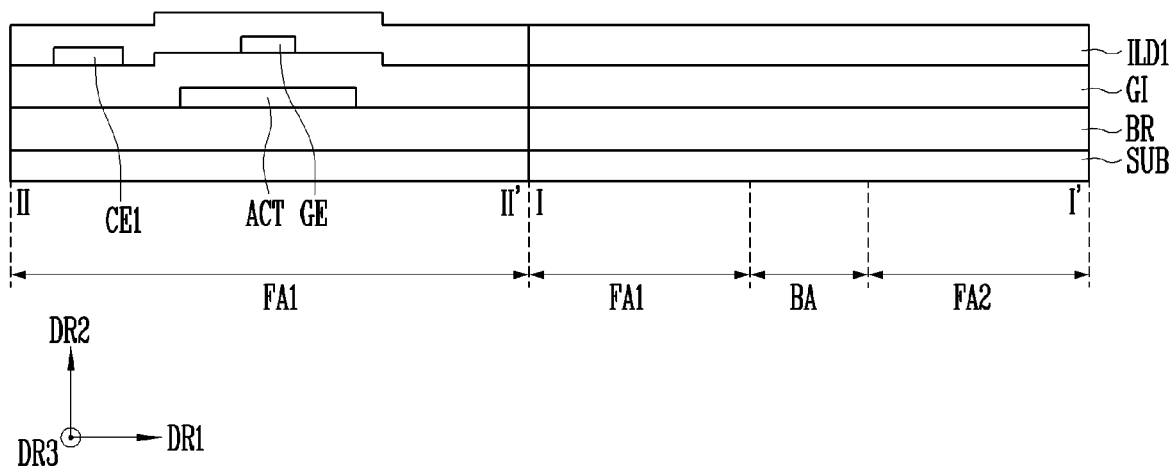

In FIG. 6E, the first interlayer insulating layer ILD1 is formed on the gate electrode GE, the first capacitor electrode CE1, and exposed portions of the gate insulating layer GI. The first interlayer insulating layer ILD1 may be formed overlapping the first non-bent region FA1 and the bent region BA. It is also contemplated that the first interlayer insulating layer ILD1 may be formed overlapping the second non-bent region FA2. The first interlayer insulating layer ILD1 may be formed via the CVD method like the barrier layer BR.

Figure 6F:
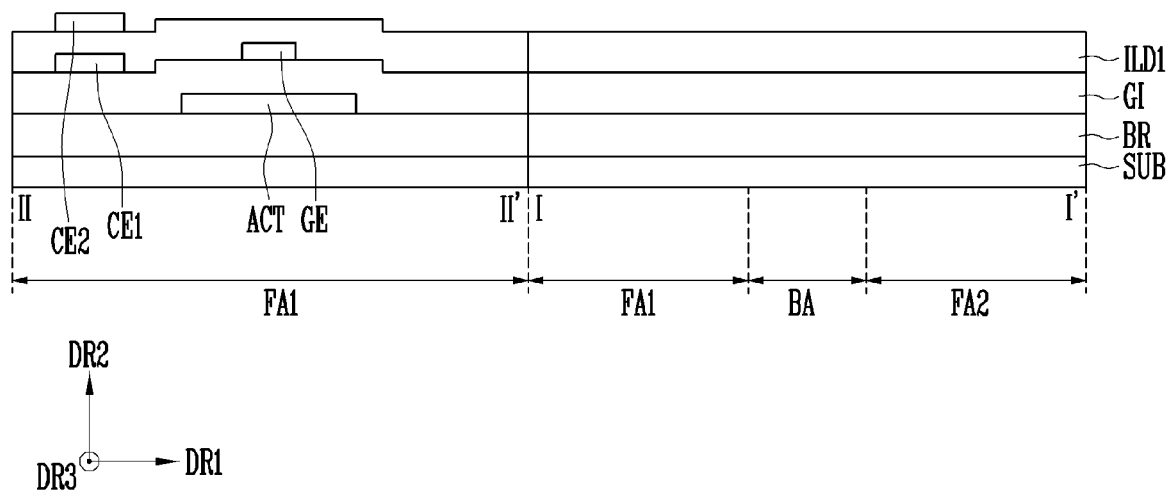

In FIG. 6F, the second capacitor electrode CE2 is formed on the first interlayer insulating layer ILD1. The second capacitor electrode CE2 may be formed overlapping the first capacitor electrode CE1, and, thereby, formed overlapping the first non-bent region FA1.

Figure 6G:
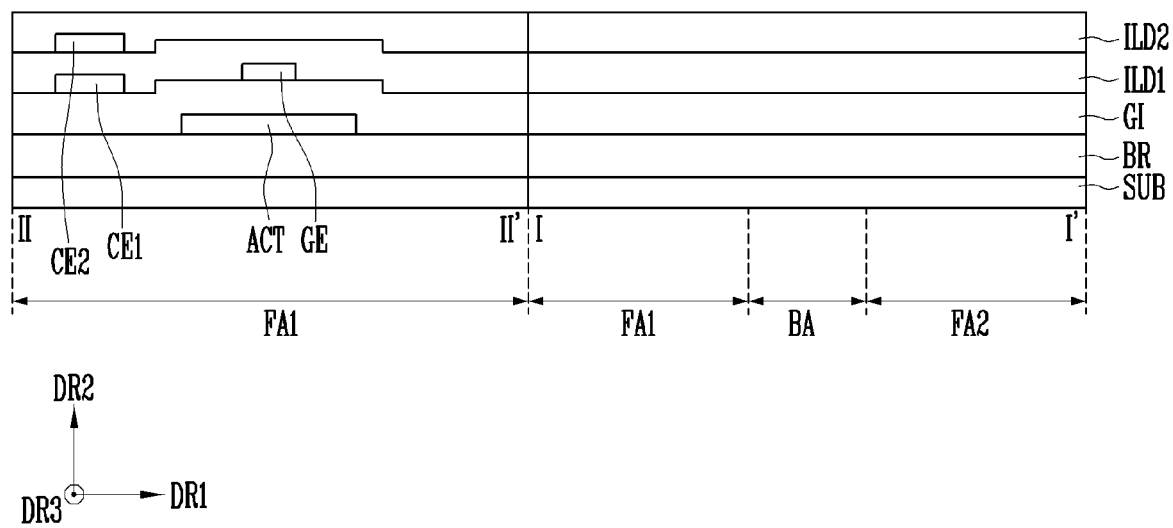

In FIG. 6G, the second interlayer insulating layer ILD2 is formed on the second capacitor electrode CE2 and exposed portions of the first interlayer insulating layer ILD1. The second interlayer insulating layer ILD2 may be formed overlapping the first non-bent region FA1 and the bent region BA. It is also contemplated that the second interlayer insulating layer ILD2 may be formed overlapping the second non-bent region FA2.

Figure 6H:
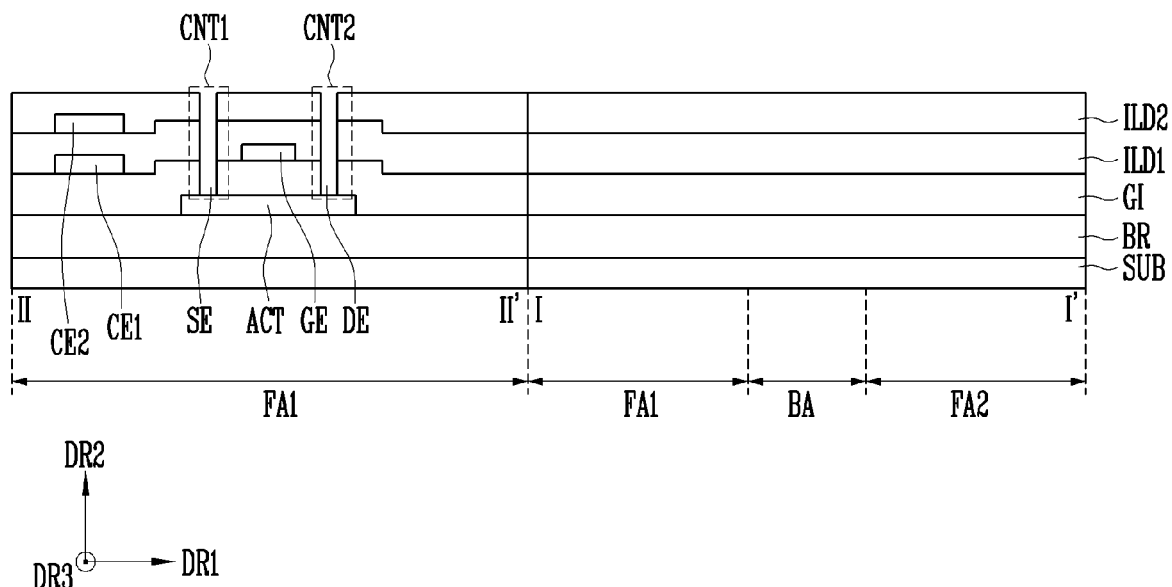

In FIG. 6H, a first contact hole CNT1 and a second contact hole CNT2 that pass through the gate insulating layer GI, the first interlayer insulating layer ILD1, and the second interlayer insulating layer ILD2 are formed. The first contact hole CNT1 and the second contact hole CNT2 may be formed via a dry etching method. Respective portions of the active pattern ACT are exposed by the first contact hole CNT1 and the second contact hole CNT2.

Figure 6I:
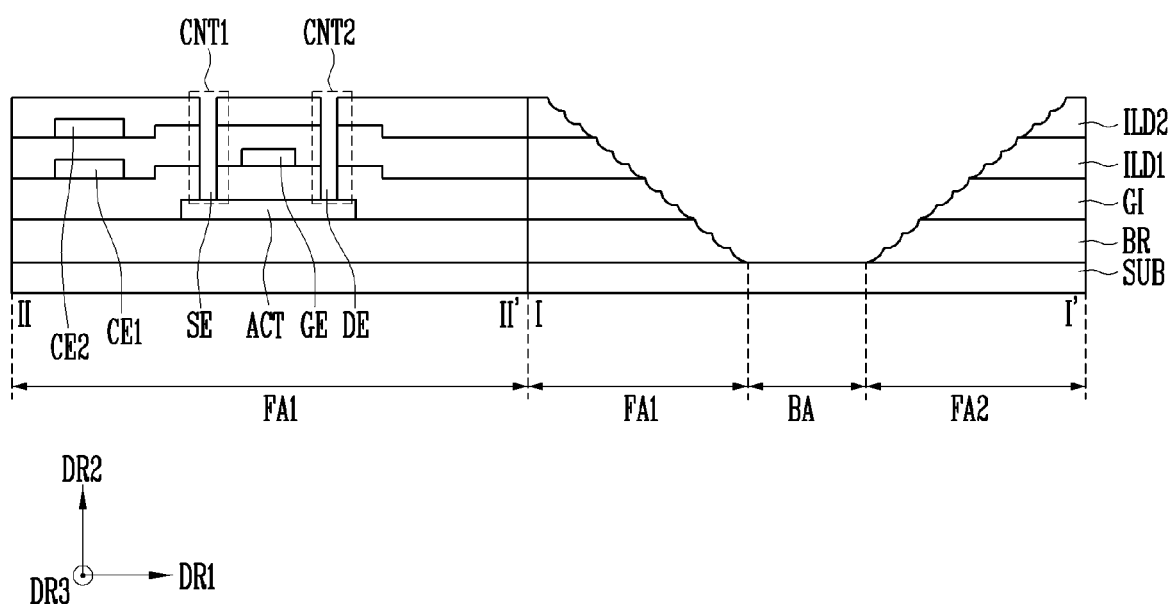

In FIG. 6I, portions of the barrier layer BR, the gate insulating layer GI, the first interlayer insulating layer ILD1, and the second interlayer insulating layer ILD2 are removed by radiating a laser onto the portions of the barrier layer BR, the gate insulating layer GI, the first interlayer insulating layer ILD1, and the second interlayer insulating layer ILD2 that are arranged in the bent region BA. Due to the radiation of laser, as illustrated in FIGS. 3A and 6I, the barrier layer BR, the gate insulating layer GI, the first interlayer insulating layer ILD1, and the second interlayer insulating layer ILD2 an opening is formed. The opening has tapered sidewalls provided with the curved surfaces CS1 through CS12.

Figure 6J:
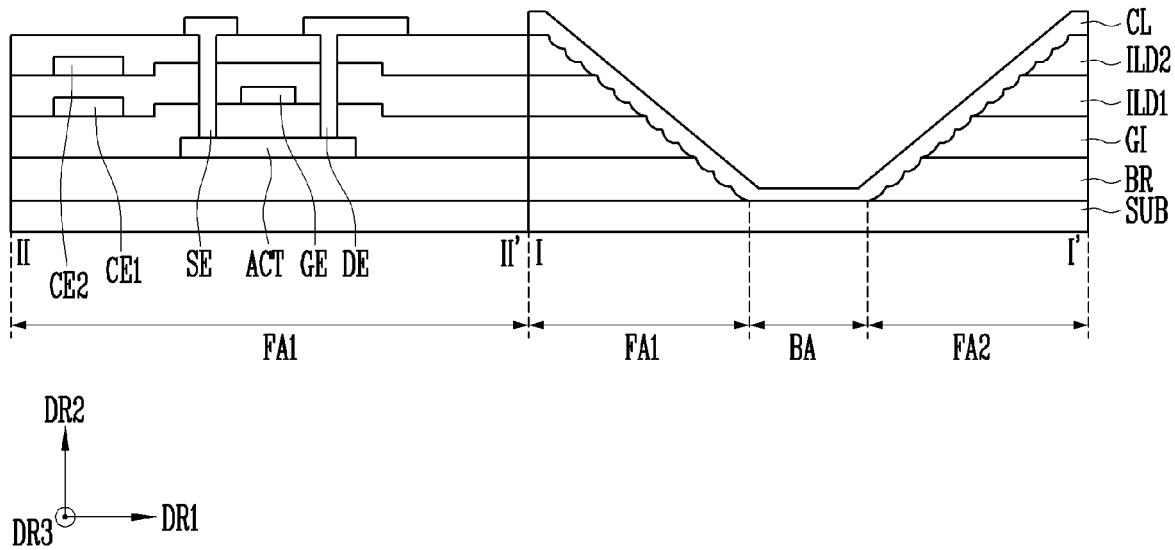

In FIG. 6J, the source electrode SE, the drain electrode DE, and the conductive layer CL are formed on the second interlayer insulating layer ILD2. The source electrode SE, the drain electrode DE, and the conductive layer CL may be formed by the PVD method like the gate electrode GE and the first capacitor electrode CE1.

Figure 6K:
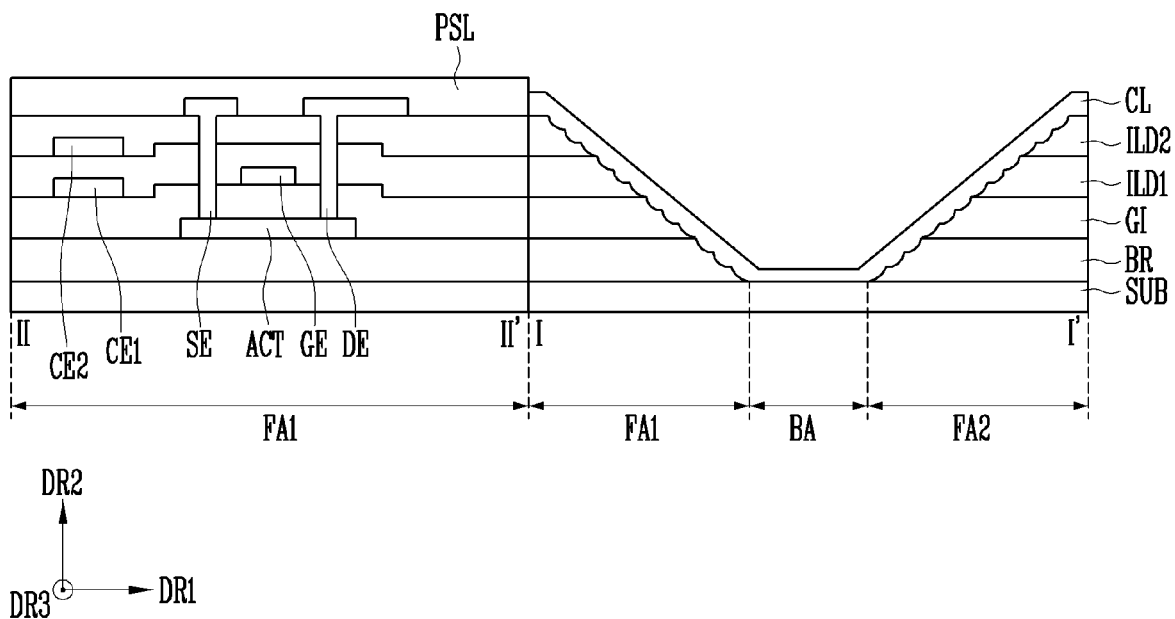

In FIG. 6K, the passivation layer PSL is formed on the source electrode SE, the drain electrode DE, and at least some exposed portions of the second interlayer insulating layer ILD2. For instance, the passivation layer PSL may not be formed overlapping the second non-bent region FA2 and the bent region BA. The passivation layer PSL may also not be formed on exposed portions of the second interlayer insulating layer ILD2 disposed in relatively close proximity to the bent region BA, e.g., exposed regions of the second interlayer insulating layer ILD2 including curved surfaces C10 through C12.

Figure 7A:
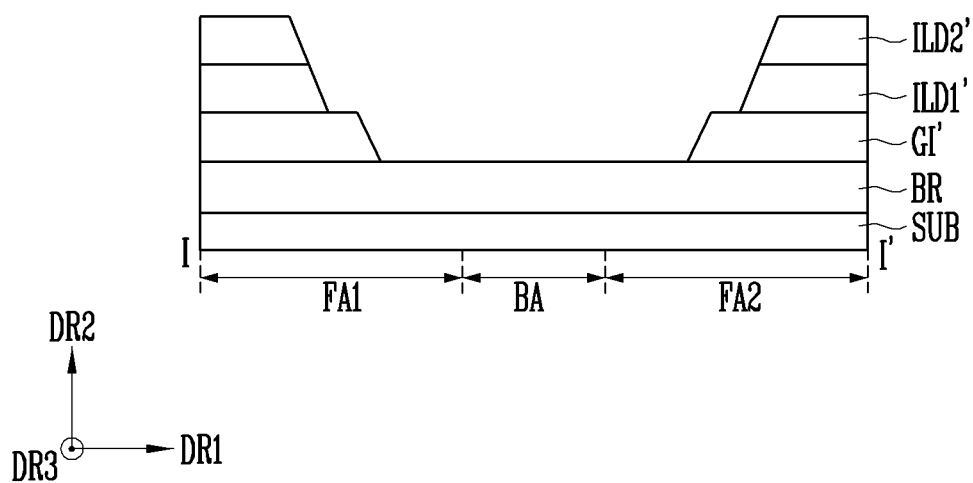
FIGS. 7A and 7B are cross-sectional views of a flexible display device at various stages of manufacture, according to one or more exemplary embodiments.
Figure 7B:
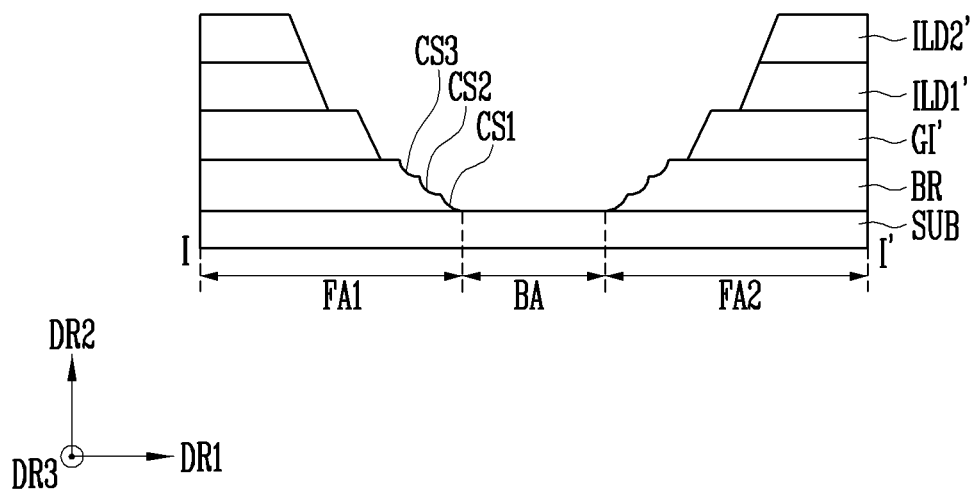

FIGS. 7A and 7B are cross-sectional views of a flexible display device at various stages of manufacture, according to one or more exemplary embodiments. For convenience, a process of manufacturing a flexible display device will be described in association with FIGS. 7A and 7B, as well as with reference to the flexible display device of FIG. 3B. Further, various intermediate features will be described and referenced as corresponding to the feature eventually formed in the flexible display device. It is also noted that the process described with reference to FIGS. 7A and 7B is similar to the process described with reference to FIGS. 6A through 6K. As such, primarily differences from the process described with reference to FIGS. 6A through 6K will be provided to avoid obscuring exemplary embodiments.

In FIG. 7A, unlike in FIG. 6H, while the first contact hole CNT1 and the second contact hole CNT2 are being formed, respective portions of the gate insulating layer GI', the first interlayer insulating layer ILD1', and the second interlayer insulating layer ILD2' arranged in the bent region BA are also patterned via etching. In this manner, the barrier layer BR is exposed via the etching process. When the gate insulating layer GI', the first interlayer insulating layer ILD1', and the second interlayer insulating layer ILD2' are etched, a halftone mask or a slit mask may be used. Use of the halftone mask or the slit mask may cause, at least in part, sidewalls of the gate insulating layer GI', the first interlayer insulating layer ILD1', and the second interlayer insulating layer ILD2' to be tapered.

In FIG. 7B, unlike in FIG. 6I, a portion of the barrier layer BR is removed by radiating a laser onto the portion of the barrier layer BR that is arranged in the bent region BA. The radiation of the laser causes, at least in part, a sidewall of the barrier layer BR to be tapered, and, thereby, provided with the curved surfaces CS1 through CS3. However, the gate insulating layer GI', the first interlayer insulating layer ILD1', and the second interlayer insulating layer ILD2' may have tapered sidewalls without curved surfaces.

After FIG. 7B, like in FIG. 6J, a conductive layer, such as conductive layer CL' of FIG. 3B, is formed on the barrier layer BR, the gate insulating layer GI', the first interlayer insulating layer ILD1', and the second interlayer insulating layer ILD2'.

Figure 8A:
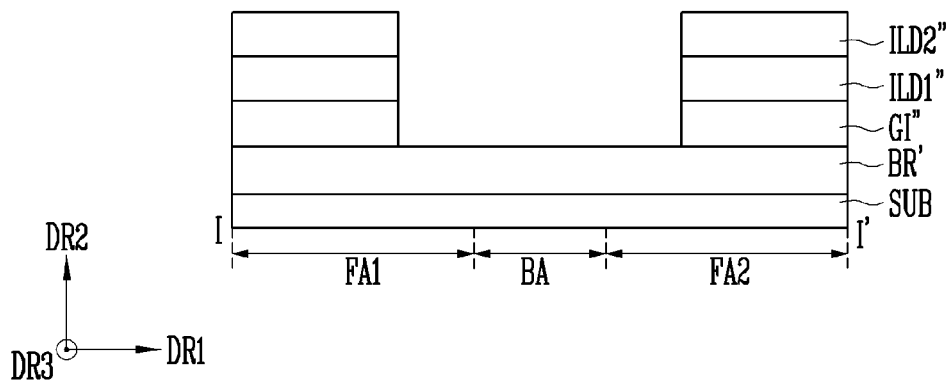
FIGS. 8A, 8B, and 8C are cross-sectional views of a flexible display device at various stages of being manufactured, according to one or more exemplary embodiments.
Figure 8B:
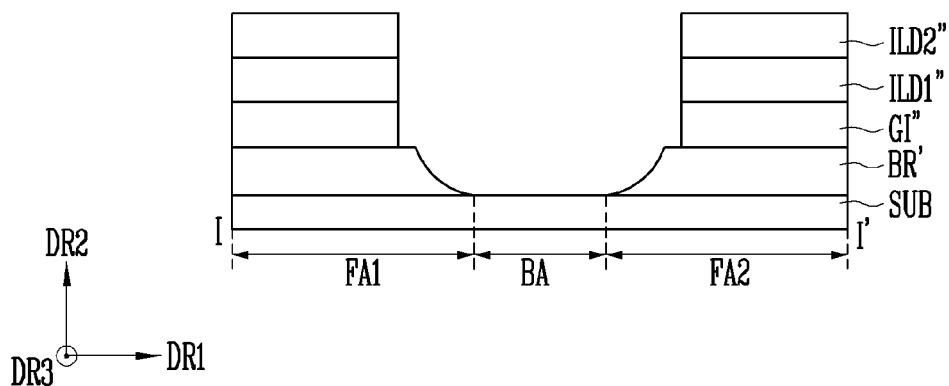
Figure 8C:
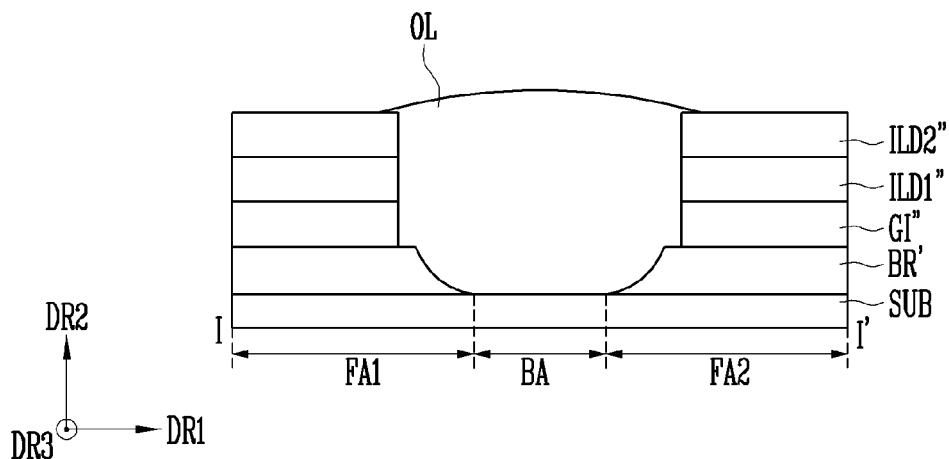

FIGS. 8A, 8B, and 8C are cross-sectional views of a flexible display device at various stages of manufacture, according to one or more exemplary embodiments. For convenience, a process of manufacturing a flexible display device will be described in association with FIGS. 8A through 8C, as well as with reference to the flexible display device of FIG. 3C. Various intermediate features will be described and referenced as corresponding to the feature eventually formed in the flexible display device. It is also noted that the process described with reference to FIGS. 8A through 8C is similar to the processes described with reference to FIGS. 6A through 6K and FIGS. 7A and 7B. As such, primarily differences from the processes described with reference to FIGS. 6A through 6K and FIGS. 7A and 7B will be provided to avoid obscuring exemplary embodiments.

In FIG. 8A, unlike in FIG. 6H, while the first contact hole CNT1 and the second contact hole CNT2 are being formed, the gate insulating layer GI", the first interlayer insulating layer ILD1", and the second interlayer insulating layer ILD2" arranged in the bent region BA are also patterned via etching. In this manner, the barrier layer BR' is exposed by the etching process. In addition, in FIG. 8A, unlike in FIG. 7A, since a halftone mask or a slit mask is not used when the gate insulating layer GI", the first interlayer insulating layer ILD1", and the second interlayer insulating layer ILD2" are being etched, the gate insulating layer GI", the first interlayer insulating layer ILD1", and the second interlayer insulating layer ILD2" do not have tapered sidewalls.

In FIG. 8B, a laser is radiated onto a part of the barrier layer BR' that is arranged in the bent region BA. Unlike in FIGS. 6I and 7B, the barrier layer BR' is not provided with a plurality of curved surfaces.

In FIG. 8C, in the bent region BA, the organic layer OL is formed on a part in which at least one of the substrate SUB and the barrier layer BR' is exposed. The organic layer OL may be formed by selectively coating an organic materials with a dispenser without a photolithography process. After FIG. 8C, like in FIG. 6J, the conductive layer CL" may be formed on the organic layer OL and exposed portions of the second interlayer insulating layer ILD2". Referring back to FIG. 3C, since the conductive layer CL" is formed on the tapered exposed portion of the organic layer OL, although the barrier layer BR' is not provided with the plurality of curved surfaces and the bent region BA is bent, the conductive layer CL" is not cut off. Further, given the increased surface area of the exposed portion of the organic layer OL, a potential for the conductive layer CL" from lifting off of the organic layer OL may be reduced.

Figure 9A:
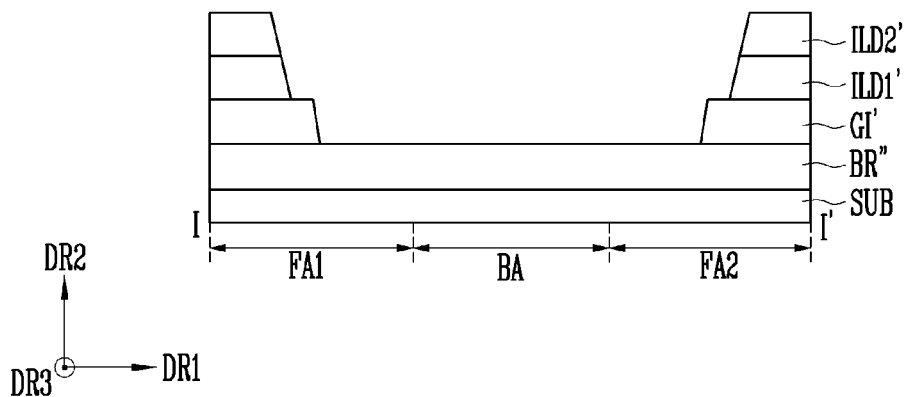
FIGS. 9A, 9B, and 9C are cross-sectional views of a flexible display device at various stages of manufacture, according to one or more exemplary embodiments.
Figure 9B:
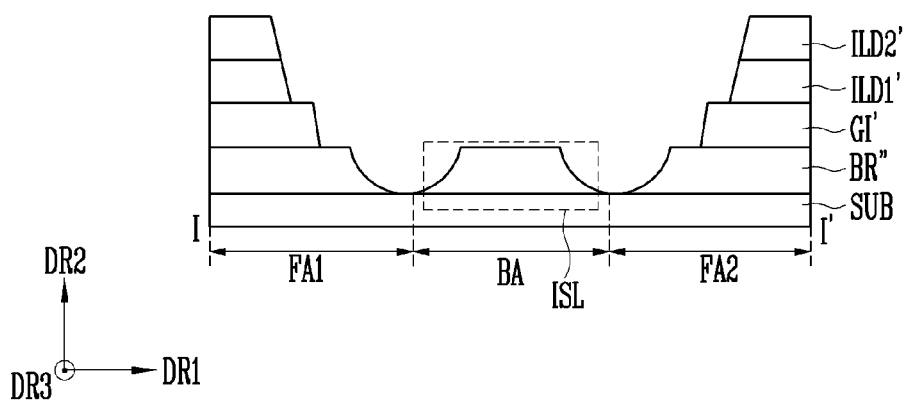
Figure 9C:
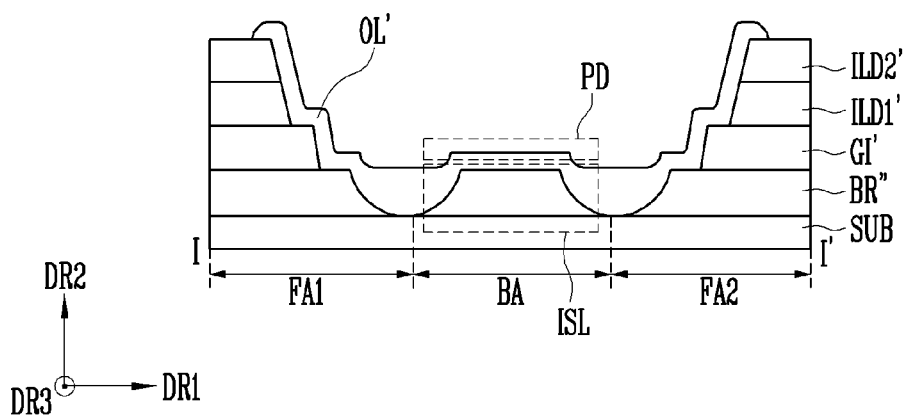

FIGS. 9A, 9B, and 9C are cross-sectional views of a flexible display device at various stages of manufacture, according to one or more exemplary embodiments. For convenience, a process of manufacturing a flexible display device will be described in association with FIGS. 9A through 9C, as well as with reference to the flexible display device of FIG. 3D. Various intermediate features will be described and referenced as corresponding to the feature eventually formed in the flexible display device. Also, the process described with reference to FIGS. 9A through 9C is similar to the processes described with reference to FIGS. 6A through 6K, FIGS. 7A and 7B, and FIGS. 8A through 8C. As such, primarily differences from the processes described with reference to FIGS. 6A through 6K, FIGS. 7A and 7B, and FIGS. 8A through 8C will be provided to avoid obscuring exemplary embodiments.

In FIG. 9A, like in FIG. 7A, while the first contact hole CNT1 and the second contact hole CNT2 are being formed, the gate insulating layer GI', the first interlayer insulating layer ILD1', and the second interlayer insulating layer ILD2' arranged in the bent region BA are also patterned via etching. In this manner, the barrier layer BR" is exposed by the etching process. As previously mentioned in association with the gate insulating layer GI', the first interlayer insulating layer ILD1', and the second interlayer insulating layer ILD2' in FIG. 7A, the gate insulating layer GI', the first interlayer insulating layer ILD1', and the second interlayer insulating layer ILD2' in FIG. 9A are etched using the slit mask or the halftone mask.

In FIG. 9B, a laser is radiated onto the barrier layer BR". Unlike in FIG. 6K, due to the radiation of the laser, the barrier layer BR" in FIG. 9B is formed including the island ISL. The island ISL does not contact other portions of the barrier layer BR" excluding the island ISL. Also, the island ISL may include tapered sidewalls.

In FIG. 9C, the organic layer OL' is formed on the barrier layer BR", the gate insulating layer GI', the first interlayer insulating layer ILD1', and the second interlayer insulating layer ILD2'. The organic layer OL' may be formed by selectively coating an organic material via a dispenser without a photolithography process. The organic layer OL' may have the concavo-convex part PD. The shape of the organic layer OL' may correspond to that of the concavo-convex part PD. After FIG. 9C, like in FIG. 6J, the conductive layer CL''' may be formed on the organic layer OL' and the second interlayer insulating layer ILD2'.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device having a bendable region and a non-bendable region arranged in a first direction, the display device comprising:
    a substrate disposed in the bendable region and the non-bendable region;
    a barrier layer disposed on the substrate in the non-bendable region and having a first side surface adjacent to the bendable region;
    an active pattern disposed on the barrier layer;
    a first insulating layer disposed on the barrier layer and the active pattern and having a second side surface adjacent to the bendable region, the second side surface being farther from the bendable region in the first direction than the first side surface;
    a first conductive pattern overlapping the active pattern and disposed on the first insulating layer;
    a second insulating layer disposed on the first conductive pattern and the first insulating layer and having a third side surface adjacent to the bendable region, the third side surface being farther from the bendable region in the first direction than the second side surface;
    a second conductive pattern disposed on the second insulating layer;
    a third insulating layer disposed on the second conductive pattern and the second insulating layer and having a fourth side surface adjacent to the bendable region, the fourth side surface being farther from the bendable region in the first direction than the third side surface;
    a third conductive pattern disposed on the third insulating layer; and
    a conductive layer contacting the first to fourth side surfaces and extending to the bendable region, the conductive layer contacting the substrate in the bendable region.

2. The display device of claim 1, wherein the first to fourth side surfaces form a sidewall, and the sidewall comprises a first portion substantially parallel to the substrate.

3. The display device of claim 1, wherein the conductive layer comprises a second portion overlapping the first portion of the side wall, the second portion being substantially parallel to the substrate.

4. The display device of claim 1, wherein:
    the first to fourth side surfaces form a sidewall;
    the sidewall comprises a first portion, a second portion, and a third portion disposed between the first portion and the second portion;
    each of an angle between the first portion and the substrate and an angle between the second portion and the substrate is an acute angle; and
    the third portion is substantially parallel to the substrate.

5. The display device of claim 4, wherein the conductive layer comprises a fourth portion overlapping the third portion, the fourth portion being substantially parallel to the substrate.

6. The display device of claim 4, wherein:
    the first portion corresponds to the first side surface and one of portions of the second side surface;
    the third portion corresponds to the other one of the portions of the second side surface;
    the second portion corresponds to the third side surface and the fourth side surface.

7. The display device of claim 1, wherein at least one of the first to fourth side surfaces comprises curved surfaces.

8. The display device of claim 7, wherein the first side surface comprises the curved surfaces.

9. The display device of claim 1, wherein each of the first to fourth side surfaces comprises curved surfaces.

10. The display device of claim 1, wherein each of the first to fourth side surfaces has an acute angle to the substrate.

11. The display device of claim 1, wherein:
    the first conductive pattern comprises a gate electrode;
    the third conductive pattern comprises source and drain electrodes; and
    the active pattern, the gate electrode, and the source and drain electrodes form a thin film transistor.

12. The display device of claim 11, wherein:
    the first insulating layer comprises a gate insulating layer;
    the second insulating layer comprises a first interlayer insulating layer;
    the third insulating layer comprises a second interlayer insulating layer;
    the active pattern is disposed between the barrier layer and the gate insulating layer;
    the gate electrode is disposed between the gate insulating layer and the first interlayer insulating layer;
    the second conductive pattern is disposed between the first interlayer insulating layer and the second interlayer insulating layer.

13. The display device of claim 12, wherein each of the source and drain electrodes is connected to the active pattern through the gate insulating layer, the first interlayer insulating layer, and the second interlayer insulating layer.

14. The display device of claim 11, further comprising a passivation layer disposed on the source and drain electrodes.

15. The display device of claim 11, further comprising a capacitor, wherein the second conductive pattern comprises an electrode of the capacitor.

16. The display device of claim 1, wherein the barrier layer comprises an inorganic insulating material.

17. The display device of claim 1, wherein the substrate comprises a material selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

18. The display device of claim 1, wherein the substrate comprises a polymer.

* * * * *